(12) United States Patent
Rauhala et al.

(10) Patent No.: US 9,411,474 B2
(45) Date of Patent: Aug. 9, 2016

(54) SHIELD ELECTRODE OVERLYING PORTIONS OF CAPACITIVE SENSOR ELECTRODES

(71) Applicant: Nokia Corporation, Espoo (FI)

(72) Inventors: Jyri Kalervo Rauhala, Tampere (FI); Seppo Tapio Turunen, Tampere (FI)

(73) Assignee: Nokia Technologies Oy, Espoo (FI)

( * ) Notice: Subject to any disclaimer, the term of this patent is extended or adjusted under 35 U.S.C. 154(b) by 158 days.

(21) Appl. No.: 13/677,399

(22) Filed: Nov. 15, 2012

(65) Prior Publication Data

US 2014/0132335 A1    May 15, 2014

(51) Int. Cl.
*G06F 3/044*     (2006.01)
*H03K 17/96*    (2006.01)

(52) U.S. Cl.
CPC ............ *G06F 3/044* (2013.01); *H03K 17/9622* (2013.01); *H03K 2017/9602* (2013.01); *H03K 2217/960765* (2013.01)

(58) Field of Classification Search
USPC .................................................. 345/156–178
See application file for complete search history.

(56) References Cited

U.S. PATENT DOCUMENTS

| | | | |
|---|---|---|---|
| 2003/0156098 A1 | 8/2003 | Shaw et al. | 345/163 |
| 2008/0238881 A1 | 10/2008 | Perski et al. | 345/173 |
| 2009/0273570 A1 | 11/2009 | Degner et al. | 345/173 |
| 2010/0194699 A1 | 8/2010 | Chang | 345/173 |
| 2010/0201647 A1* | 8/2010 | Verweg | 345/174 |
| 2010/0220071 A1 | 9/2010 | Nishihara | |
| 2011/0007021 A1* | 1/2011 | Bernstein et al. | 345/174 |
| 2011/0279383 A1 | 11/2011 | Wilson et al. | 345/173 |
| 2011/0279409 A1 | 11/2011 | Salaverry et al. | 345/174 |
| 2011/0285661 A1 | 11/2011 | Hotelling | 345/174 |
| 2011/0310037 A1 | 12/2011 | Moran et al. | 345/173 |
| 2012/0044199 A1* | 2/2012 | Karpin et al. | 345/174 |
| 2012/0081328 A1 | 4/2012 | Kandziora et al. | 345/174 |
| 2012/0299868 A1* | 11/2012 | Bhagavat et al. | 345/174 |
| 2013/0033450 A1* | 2/2013 | Coulson | G06F 3/044 345/174 |
| 2013/0181949 A1* | 7/2013 | Setlak | 345/175 |

FOREIGN PATENT DOCUMENTS

| | | | |
|---|---|---|---|
| EP | 2141573 A2 | 1/2010 | |
| EP | 2354901 A1 | 8/2011 | |
| JP | 2009169720 A | 7/2009 | |
| WO | WO-2008104406 A2 | 9/2008 | |

\* cited by examiner

*Primary Examiner* — Kent Chang
*Assistant Examiner* — Nathan Brittingham
(74) *Attorney, Agent, or Firm* — Harrington & Smith

(57) ABSTRACT

An apparatus including: an array of capacitive sensor electrodes including a plurality of distinct capacitive sensor electrodes distributed over a sensing area; conductive traces connected to respective ones of the plurality of distinct capacitive sensor electrodes; and a shield electrode overlying, in the sensing area, conductive traces.

16 Claims, 4 Drawing Sheets

SHIELD ELECTRODE OVERLYING PORTIONS OF CAPACITIVE SENSOR ELECTRODES

TECHNOLOGICAL FIELD

Embodiments of the present invention relate to an apparatus. In particular, they relate to an apparatus comprising a plurality of capacitive sensor electrodes distributed over a sensing area.

BACKGROUND

Current touch sensitive displays may use a plurality of capacitive sensor electrodes distributed over a sensing area. The capacitive sensor electrodes sense a proximal grounded object such as a user's finger touching the sensing area.

BRIEF SUMMARY

According to various, but not necessarily all, embodiments of the invention there is provided an apparatus comprising: an array of capacitive sensor electrodes comprising a plurality of distinct capacitive sensor electrodes distributed over a sensing area; conductive traces connected to respective ones of the plurality of distinct capacitive sensor electrodes; and a shield electrode overlying, in the sensing area, conductive traces.

According to various, but not necessarily all, embodiments of the invention there is provided an apparatus comprising: a sensing arrangement comprising a plurality of capacitive sensor electrodes distributed over a sensing area and conductive traces at least partially distributed over the sensing area; and a shield electrode partially overlying, in the sensing area, the sensing arrangement.

BRIEF DESCRIPTION

For a better understanding of various examples of embodiments of the present invention reference will now be made by way of example only to the accompanying drawings in which.

Figure 7A:
Figure 7B:
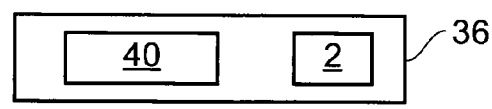
Figure 6A:
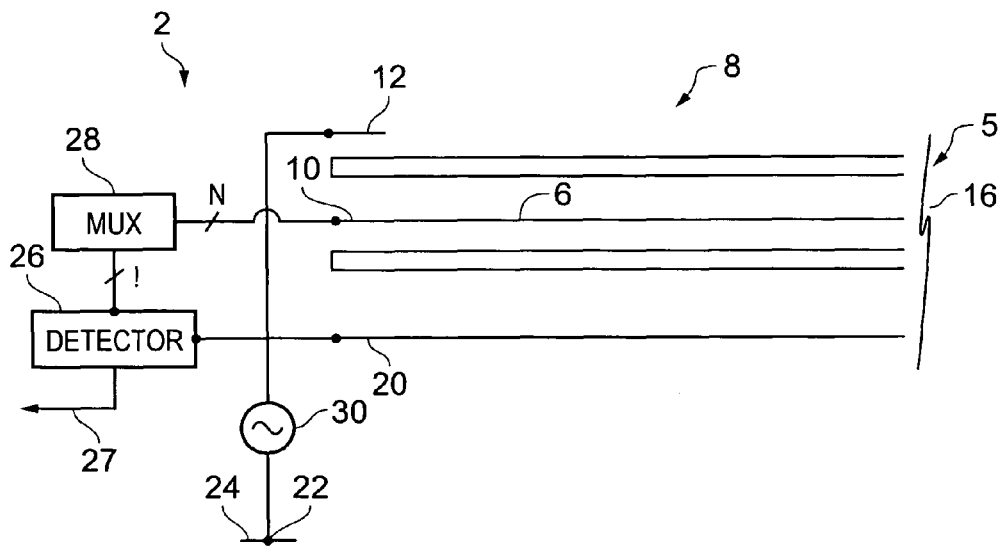
Figure 6B:
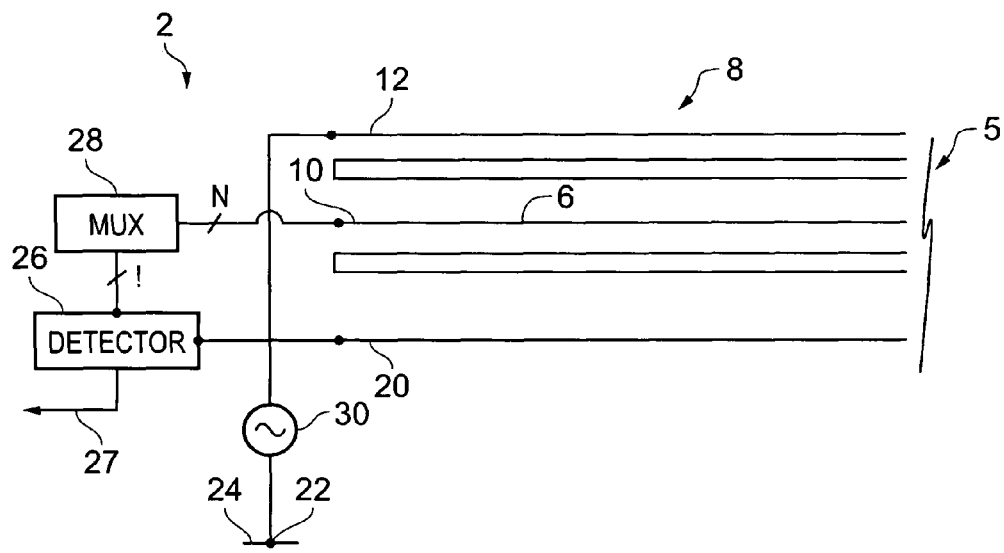

FIGS. 6A and 6B schematically illustrates cross-sections through the same sensing arrangement;

FIG. 7A illustrates a touch panel module;

FIG. 7B illustrates a touch sensitive display module; and

Figure 7C:
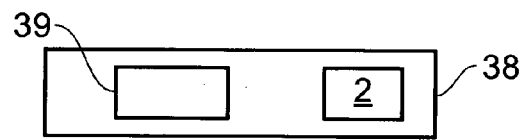

FIG. 7C illustrates an electronic device.

DETAILED DESCRIPTION

The Figures illustrate an apparatus 2 comprising: an array 4 of capacitive sensor electrodes 6 comprising a plurality of distinct capacitive sensor electrodes 6 distributed over a sensing area 8; conductive traces 10 connected to respective ones of the plurality of distinct capacitive sensor electrodes 6; and a shield electrode 12 overlying, in the sensing area 8, conductive traces 10.

Figure 1:
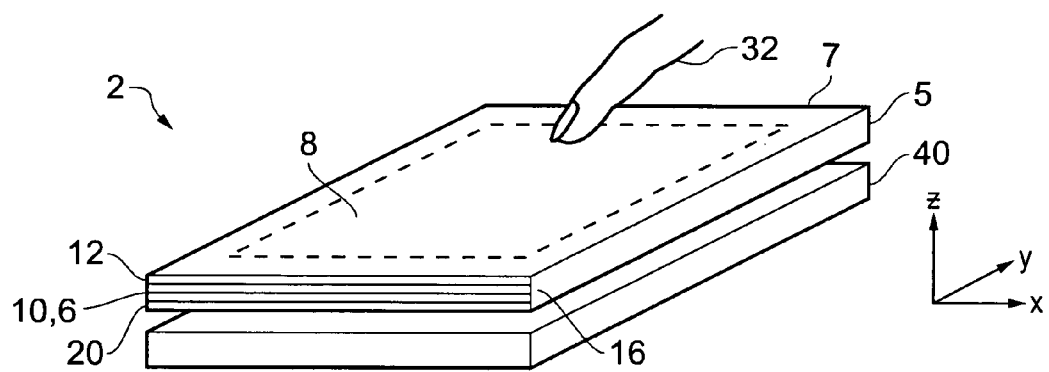
FIG. 1 illustrates an apparatus comprising a sensing arrangement comprising a plurality of capacitive sensor electrodes distributed over a sensing area.

FIG. 1 illustrates an apparatus 2 comprising: a sensing arrangement 5 comprising a plurality of capacitive sensor electrodes 6 distributed over a sensing area 8 and conductive traces 10 at least partially distributed over the sensing area 8; and a shield electrode 12 partially overlying, in the sensing area 8, the sensing arrangement 5.

In this example, the apparatus 2 overlies a display 40 and operates as a capacitive touch panel for the display 40. The display 40 and the apparatus 2 in combination form a touch sensitive display configured to detect a variation in capacitance arising from proximity of a user input device 32 to one or more of the plurality of sensor electrodes 6.

The sensing arrangement 5 is configured to sense a variation in capacitance arising from proximity of a user input device 32 at or over the sensing area 8 of a touch surface 7. In this example the user input device 32 is a user's finger.

The apparatus 2 is configured to sense not only the (x, y) position of the user's finger within the sensing area 8 when it touches the sensing area 8 of the touch surface 7 but may also, in this example, additionally provide a (z) position of the user's finger when it is close to but not touching the sensing area 8 of the touch surface 7 and/or provide an (x, y) position of the user's finger when it is close to but not yet touching the sensing area of the touch surface 7. The apparatus 2 therefore provides for not only two-dimensional sensing but also three-dimensional sensing.

Optionally, the apparatus 2 may also comprise a further shield electrode 20 underlying, in the sensing area 8, the conductive traces 10 and the sensor electrodes 6. The further shield electrode 12 may be a continuous uninterrupted electrode.

The shield electrode 12, the conductive traces 10, the capacitive sensor electrodes 6 and, if present, the further shield electrode 20 are all positioned at least within the sensing area 8 and overlie, in this example, a display 40. As they overlie a display 40 they are preferably transparent.

The shield electrode 12, the conductive traces 10, the capacitive sensor electrodes 6 and, if present, the further shield electrode 20 may therefore be formed from conductive and transparent material. They may be formed from the same or similar material or mixtures of material. Examples of suitable conductive and transparent materials include, for example, Indium-Tin-Oxide (ITO), metal mesh, silver nanowires and carbon nanotube composite.

Figure 2:
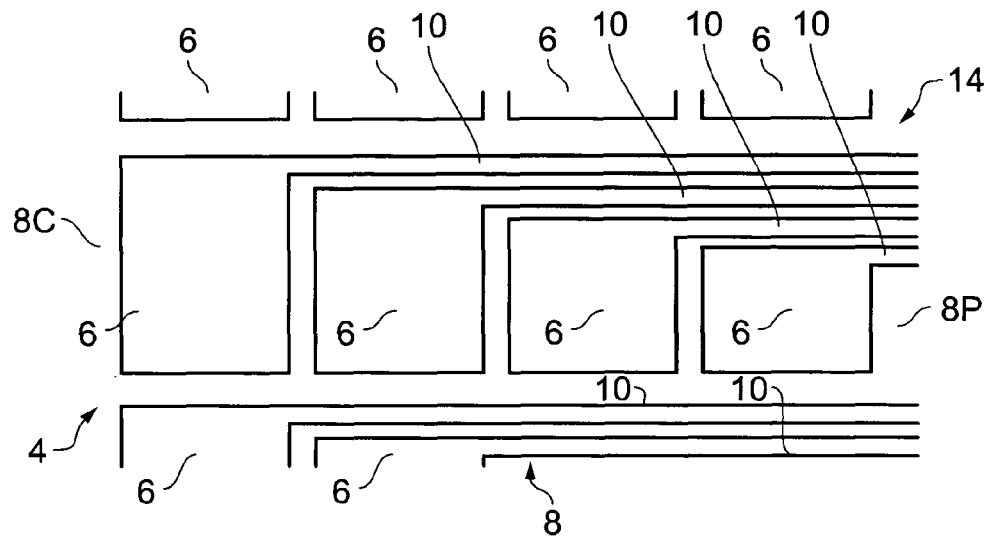
FIG. 2 illustrates one example of a sensing arrangement 5 comprising a plurality of capacitive sensor electrodes distributed over a sensing area.

FIG. 2 illustrates one example of a sensing arrangement 5 comprising a plurality of capacitive sensor electrodes 6 distributed over a sensing area 8 and conductive traces 10 partially distributed over the sensing area 8. The plurality of capacitive sensor electrodes 6 are arranged as a regular array 4 in this example. The capacitive sensor electrodes are arranged as an N row by M column regular array 4, with common fixed spacing between columns and common fixed spacing between rows.

Each capacitive sensor electrode 6 has an associated conductive trace 10 for conveying a signal generated by that sensor electrode 6 away from the sensor area 8. In the illustrated example, each sensor electrode 6 and its associated conductive trace 10 is physically connected. The sensor electrodes 6 and the conductive traces 10 may be arranged within a common plane. They may, for example, be formed by patterning a planar layer of transparent conductive material.

In this example, the sensor electrodes 6 have different sizes. The sensor electrodes 6 are larger towards a center region 8C of the sensing area 8 and smaller towards a perimeter 8P of the sensing area 8. This is because the area 14 occupied by the conductive traces 10 becomes increasingly lager as one travels from the center 8C to the perimeter 8P.

In this example the sensor electrodes 6 have sizes less than 0.5 cm². They may for example have dimensions of less than 6 mm by 6 mm.

Figure 3:
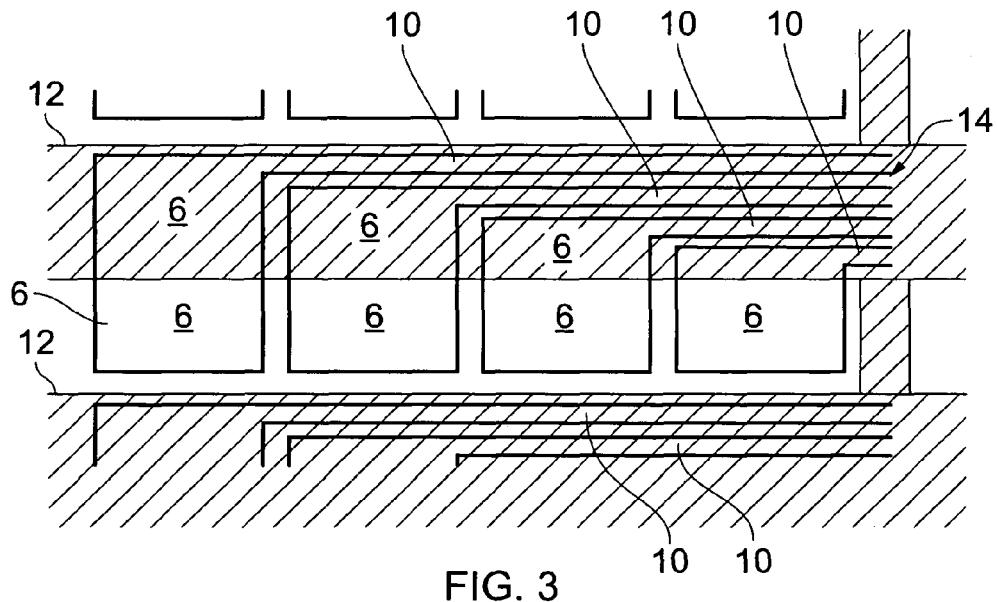
FIG. 3 illustrates a shield electrode overlying, in the sensing area, conductive traces.

FIG. 3 illustrates a shield electrode 12 overlying, in the sensing area 8, conductive traces 10.

The shield electrode 12, in this example but not necessarily all examples, overlies at least portions of at least some of the sensor electrodes 6.

The portions of the sensor electrodes 6 that are uncovered define operational sensor electrodes 6 of equal operational size, in this example. As the sensor electrodes 6 are of similar construction they have the same capacitance per unit area. Therefore the operational sensor electrodes 6 of equal operational size have equal capacitance.

In the illustrated example, the shield electrode 12 overlies, in the sensing area 8, all of the conductive traces 10. In other examples, the shield electrode 12 does not overlie, in the sensing area 8, all of the conductive traces 10 but instead overlies more than 80% of the area 14 occupied by the conductive traces 10.

It is desirable to keep the electrical resistance of the conductive traces 10 small to reduce resistance-capacitance (RC) delays and improve measurement speed. This may be achieved by using material that has a higher conductivity and/or by making the conductive traces 10 wider. However, widening the conductive traces 10 increases the area 14 occupied by the conductive traces 10 and may create undesirable stray capacitance effects. However this effect is reduced or eliminated by the overlying shield electrode 12.

Figure 4:
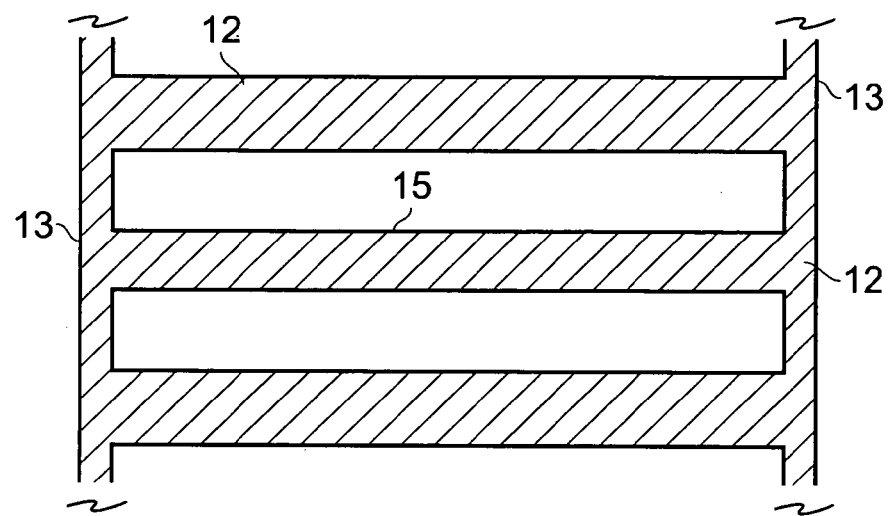
FIG. 4 illustrates the shield electrode used in FIG. 3.

As illustrated in FIG. 4, the shield electrode 12 may extends across the whole of the sensing area 8 as a strip 15. In this example there are multiple parallel strips 15 and a guard portion 13 that extends around the perimeter of the sensing area 8. A strip may be associated with each row of capacitive sensor electrodes 6 (as illustrated in FIG. 3).

Figure 5:
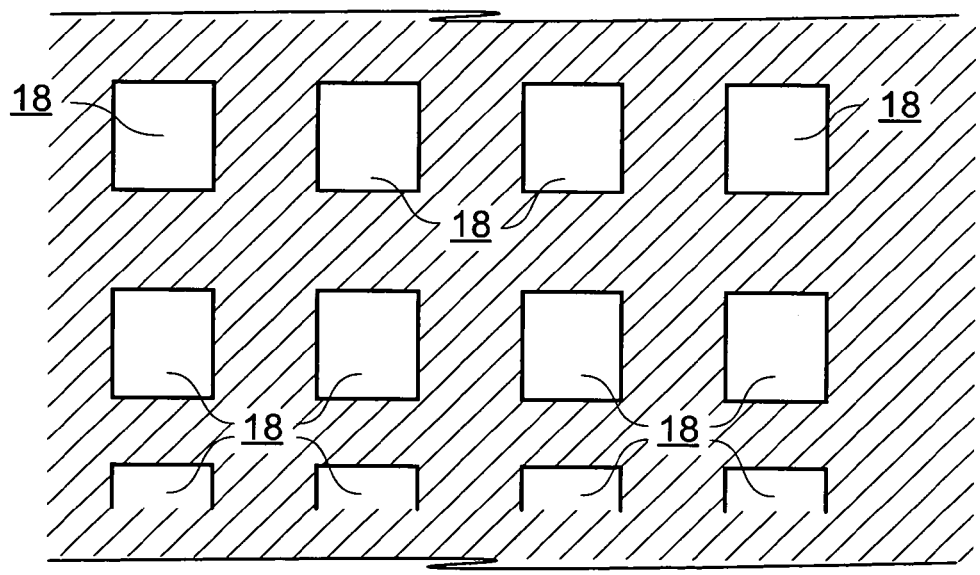
FIG. 5 illustrates another example of a shield electrode.

As illustrated in FIG. 5, the shield electrode 12 may cover the whole of the sensing area 8 except at openings 18 through the shield electrode 18 to the underlying capacitive sensor electrodes 6. The openings 18 are of equal size. The openings 18 can be of any shape (for example, rectangle (as shown in the attached drawing), round, star etc.).

The portions of the sensor electrodes 6 that are uncovered define operational sensor electrodes 6 of equal operational size. As the sensor electrodes 6 are of similar construction they have the same capacitance per unit area. Therefore the operational sensor electrodes 6 of equal operational size have equal capacitance.

FIG. 6A schematically illustrates a cross-section through the sensing arrangement 5 along a line corresponding to an 'operational' capacitive sensor electrode. That is the shield electrode 12 along this cross-section does not cover the capacitive sensing electrodes 6. In the example of FIG. 4, the portion of the shield electrode 12 illustrated is part of the guard portion 13. In the example of FIG. 5, the portion of the shield electrode 12 illustrated may be part of a guard portion 13 adjacent a perimeter of the sensing area 8 or a portion between two adjacent openings 18 to adjacent capacitive sensing electrodes 6.

FIG. 6B schematically illustrates a cross-section through the sensing arrangement 5 along a line corresponding to where the shield electrode 12 is present in the sensing area 8. That is the shield electrode 12 along this cross-section does covers all or some of the conductive traces 10 and, optionally, some of the capacitive sensor electrode 12. In the example of FIG. 4, the portion of the shield electrode 12 illustrated is part of the strip 15. In the example of FIG. 5, the portion of the shield electrode 12 illustrated may be part of portion between two adjacent rows (or columns) of capacitive sensing electrodes 12.

In FIGS. 6A and 6B, the sensor electrodes 6 and the conductive traces 10 may be arranged within a common plane 16. They may, for example, be formed by patterning a planar layer of transparent conductive material.

In FIGS. 6A and 6B, the apparatus 2 may comprise circuitry as described below, however other circuitry is possible. Such circuitry may be configured to provide a voltage to the shield electrode 12. If the further shield electrode 20 is present, the same voltage may be provided to the shield electrode 12 and the further shield electrode 20. The provided voltage may be a fixed voltage or a time-varying voltage. One of many examples of a time varying voltage is an alternating sinusoidal voltage.

In FIGS. 6A and 6B, the shield electrode 12 is operatively connected to a node 22. Operatively connected means that there is a signal path but they may or may not be directly physically connected. When the apparatus 2 is operational the node 22 is held at a constant potential such as, for example, ground potential. Circuitry 24 is configured to provide the constant potential. This could be a simple galvanic connection to ground provided by, for example, a housing, a ground plane or a chassis.

In this example, a further shield electrode 20 is present. It is also operatively connected to the node 22.

Detection circuitry 26 is operatively connected between the further shield electrode 20 and the array 4 of capacitive sensor electrodes 6.

A multiplexer 28 is operatively connected between the detection circuitry 26 and the array 4 of capacitive sensor electrodes 6. The multiplexer 28 is configured to isolate, for detection, each of the plurality of capacitive sensor electrodes 6 of the array 4.

In this example, drive circuitry 30 is configured to provide a time-varying voltage to the shield electrode 12 and, if present, the further shield electrode 20. The time-varying voltage may be, for example, an alternating sinusoidal voltage.

The drive circuitry 30 is thus configured to provide a time varying electric field at each of the sensor electrodes 6.

The detection circuitry 26 is configured to detect a variation in capacitance arising from proximity of a user input device 32 to one or more of the plurality of sensor electrodes 6. The detection circuitry 26 may comprise a low-impedance charge amplifier.

When the user's hand, or some other grounded user input device 32, is brought to the vicinity of the sensing area 8 of the apparatus 2, a capacitive current flows from the shielding electrode 12 through the detection circuitry 26 to one or more capacitive sensing electrodes 6. The charge amplifier in the detection circuitry 26 registers a charge displacement due to the current. The output of the charge amplifier may be rectified, for example synchronously rectified, and integrated, after which it is passed to an analog-to-digital converter and then provided as digital output 27 for processing in the digital domain.

The drive voltage and the drive frequency typically range from 1 V to 10 V and from 10 to 200 kHz, respectively.

Due to reasons of cost and size, a single charge amplifier and a single analog-to-digital converter may be used in the detection circuitry 26 for multiple capacitive sensing electrodes 6 and a multiplexer 28 may be used to isolate for sensing each capacitive sensing electrode 6 separately.

FIG. 7A illustrates a touch panel module 34 that comprise the apparatus 2. The touch panel module may be used in combination with a display to form a touch screen display.

FIG. 7B illustrates a touch sensitive display module 36 that comprises the apparatus 2 and a display 40.

FIG. 7C illustrates an electronic device 38 that comprises at least the apparatus 2. It may, for example, additionally comprise a processor 39 that processes the output 27 of the detection circuitry 26.

As used here 'module' refers to a unit or apparatus that excludes certain parts/components that would be added by an end manufacturer or a user.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
    an array of capacitive sensor electrodes comprising a plurality of distinct capacitive sensor electrodes distributed over a sensing area;
    conductive traces connected to respective ones of the plurality of distinct capacitive sensor electrodes; and
    a shield electrode overlying, in the sensing area, conductive traces and portions of at least some of the sensor electrodes;
    wherein the shield electrode overlies, in the sensing area, and covers all of the conductive traces;
    wherein the shield electrode overlying portions of at least some of the sensor electrodes defines uncovered portions of the sensor electrodes as operational sensor electrodes of equal operational size; and
    wherein the shield electrode extends across the whole sensing area as a strip except at openings through the shield electrode to the underlying capacitive sensor electrodes, the openings defining multiple parallel shielding strips, each parallel strip associated with each row of capacitive sensor electrodes, the portions of the sensor electrodes that are uncovered defining operational sensor electrodes of equal operational size.

2. An apparatus as claimed in claim 1, wherein the shield electrode overlies, in the sensing area, more than 80% of the area occupied by the conductive traces.

3. An apparatus as claimed in claim 1, wherein the sensor electrodes have different sizes.

4. An apparatus as claimed in claim 1, wherein the sensor electrodes are larger towards a center region of the sensing area and smaller towards a perimeter of the sensing area.

5. An apparatus as claimed in claim 1, wherein the sensor electrodes and the conductive traces are arranged within a common plane.

6. An apparatus as claimed in claim 1, wherein the sensor electrodes and the conductive traces are transparent.

7. An apparatus as claimed in claim 1, wherein the shield electrode overlying at least portions of at least some of the sensor electrodes defines operational sensor electrodes of equal operational capacitance.

8. An apparatus as claimed in claim 1, wherein the shield electrode overlying the sensor electrodes comprises openings of equal size to the sensor electrodes.

9. An apparatus as claimed in claim 1, further comprising a second further shield electrode underlying, in the sensing area, the conductive traces and the sensing electrodes.

10. An apparatus as claimed in claim 9, wherein the further shield electrode is a continuous uninterrupted electrode.

11. An apparatus as claimed in claim 9, comprising circuitry configured to provide a time-varying reference voltage signal to the further shield electrode.

12. An apparatus as claimed in claim 1, comprising circuitry configured to provide a time-varying reference voltage signal to the shield electrode.

13. An apparatus as claimed in claim 9, comprising detection circuitry connected between the further shield electrode and the array of capacitive sensor electrodes.

14. An apparatus as claimed in claim 13 comprising a multiplexer connected between the detection circuitry and the array of capacitive sensor electrodes, wherein the multiplexer is configured to isolate, for detection, each of the plurality of capacitive sensor electrodes of the array.

15. An apparatus comprising:
    a sensing arrangement comprising a plurality of capacitive sensor electrodes distributed over a sensing area and conductive traces at least partially distributed over the sensing area; and
    a shield electrode partially overlying, in the sensing area, the sensing arrangement and portions of at least some of the sensor electrodes;
    wherein the shield electrode overlies, in the sensing area, and covers all of the conductive traces;
    wherein the shield electrode overlying at least portions of some of the sensor electrodes defines uncovered portions of the sensor electrodes as operational sensor electrodes of equal operational size; and
    wherein the shield electrode extends across the whole sensing area as a strip except at openings through the shield electrode to the underlying capacitive sensor electrodes, the openings defining multiple parallel shielding strips, each parallel strip associated with each row of capacitive sensor electrodes, the portions of the sensor electrodes that are uncovered defining operational sensor electrodes of equal operational size.

16. An apparatus as claimed in claim 1 embodied as device selected from the group comprising: a touch panel module; a touch sensitive display module; and an electronic device.

\* \* \* \* \*